(12) United States Patent
Zhao et al.

(10) Patent No.: US 12,376,290 B2
(45) Date of Patent: Jul. 29, 2025

(54) SEMICONDUCTOR STRUCTURE HAVING BURIED WORD LINE STRUCTURE WITH DIELECTRIC LAYERS OF DIFFERENT DIELECTRIC CONSTANTS, AND MANUFACTURING METHOD THEREOF

(71) Applicant: CHANGXIN MEMORY TECHNOLOGIES, INC., Hefei (CN)

(72) Inventors: Yongli Zhao, Hefei (CN); Zhicheng Shi, Hefei (CN); Yachao Xu, Hefei (CN); Yong Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 433 days.

(21) Appl. No.: 18/150,934

(22) Filed: Jan. 6, 2023

(65) Prior Publication Data

US 2024/0090205 A1    Mar. 14, 2024

(30) Foreign Application Priority Data

Sep. 8, 2022    (CN) .......................... 202211096035.0

(51) Int. Cl.
*H10B 12/00*    (2023.01)
*H10D 64/27*    (2025.01)

(52) U.S. Cl.
CPC ........... *H10B 12/488* (2023.02); *H10B 12/02* (2023.02); *H10B 12/485* (2023.02); *H10D 64/513* (2025.01)

(58) Field of Classification Search
CPC .... H10B 12/488; H10B 12/02; H10B 12/485; H10D 64/513
See application file for complete search history.

(56) References Cited

U.S. PATENT DOCUMENTS

2016/0315088 A1* 10/2016 Kang ................. H10D 30/0275

FOREIGN PATENT DOCUMENTS

CN    113054005 A    6/2021

* cited by examiner

*Primary Examiner* — Herve-Louis Y Assouman
(74) *Attorney, Agent, or Firm* — Kilpatrick Townsend & Stockton LLP

(57) ABSTRACT

The present disclosure provides a semiconductor structure and a manufacturing method thereof. The semiconductor structure includes a substrate, a word line, and at least two dielectric layers. The word line is arranged in the substrate; the at least two dielectric layers are located between the word line and the substrate and have different dielectric constants.

13 Claims, 12 Drawing Sheets

SEMICONDUCTOR STRUCTURE HAVING BURIED WORD LINE STRUCTURE WITH DIELECTRIC LAYERS OF DIFFERENT DIELECTRIC CONSTANTS, AND MANUFACTURING METHOD THEREOF

CROSS-REFERENCE TO RELATED APPLICATION

This application claims the priority of Chinese Patent Application No. 202211096035.0, submitted to the Chinese Intellectual Property Office on Sep. 8, 2022, the disclosure of which is incorporated herein in its entirety by reference.

TECHNICAL FIELD

The present disclosure relates to the technical field of semiconductors, and in particular to a semiconductor structure and a manufacturing method thereof.

BACKGROUND

With the advancement of integration of the dynamic random access memory, buried word line structure has become the mainstream. When a gate-drain overlap region has a strong electric field, tunneling of electrons near the interface of the overlap region occurs between a valence band and a conduction band to form a current, which is generally referred to as gate-induced drain leakage (GIDL) current.

As the transistor size shrinks, the GIDL current is more likely to occur between a word line and an active region in a dynamic random access memory with the buried word line structure, and the channel leakage risk increases accordingly.

SUMMARY

An overview of the subject described in detail in the present disclosure is provided below. This overview is not intended to limit the protection scope of the claims.

The present disclosure provides a semiconductor structure and a manufacturing method thereof.

A first aspect of the present disclosure provides a semiconductor structure, including:
a substrate;
a word line, arranged in the substrate; and
at least two dielectric layers, located between the word line and the substrate;
where the at least two dielectric layers have different dielectric constants.

A second aspect of the present disclosure provides a semiconductor structure, where the semiconductor structure includes:
providing a substrate; and
forming a word line and at least two dielectric layers in the substrate, where the at least two dielectric layers are located between the word line and the substrate, and the at least two dielectric layers have different dielectric constants.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

As the transistor size shrinks, a distance between a word line and a bit line contact member decreases continuously in a dynamic memory with a buried word line structure.

Figure 1:
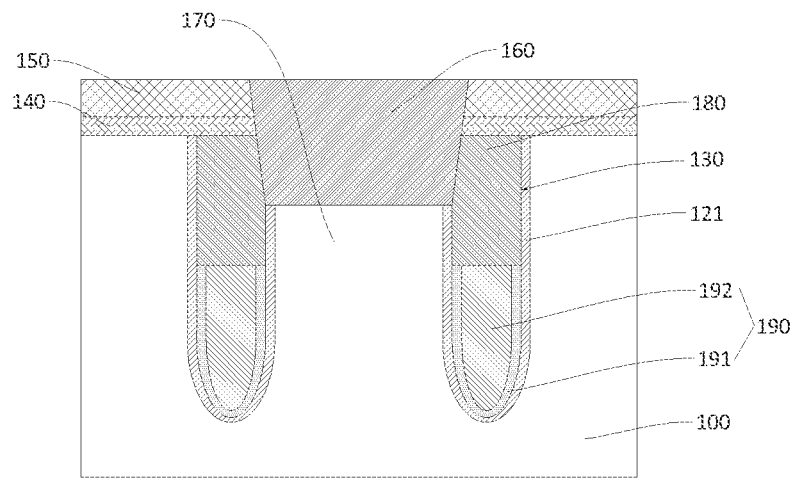
FIG. 1 is a schematic structural diagram of a semiconductor structure in the related art.

FIG. 1 shows a semiconductor structure in the related art. As shown in FIG. 1, the semiconductor structure includes a substrate 100, a word line, a covering layer 180, and a gate dielectric layer 121. A word line trench 110 is provided in the substrate 100. The gate dielectric layer 121 covers a sidewall and a bottom wall of the word line trench 110, and defines a cavity 130 in the word line trench 110. The word line is located in the cavity 130, and includes a laminated structure 190. The laminated structure 190 includes an anti-diffusion layer 191 and a second metal conductive layer 192. The anti-diffusion layer 191 covers a bottom wall and part of a sidewall of the cavity 130. A bottom surface of the covering layer 180 is in contact with the laminated structure 190, and a side surface of the covering layer 180 covers the other part of the sidewall of the cavity 130. The semiconductor structure further includes an isolation layer 140, a polysilicon layer 150, and a bit line contact member 160. The polysilicon layer 150 is a part of a bit line. The polysilicon layer 150 is stacked above the isolation layer 140, and a bottom surface of the isolation layer 140 is in contact with a top surface of the substrate 100. The bit line contact member 160 penetrates the isolation layer 140 and the polysilicon layer 150, and has a bottom surface in contact with a doped region 170 of an active region and a side surface in contact with the covering layer 180.

In the semiconductor structure described above, the bit line contact member 160 and the word line are merely isolated by the gate dielectric layer 121 and the covering layer 180. In the transistor with such a structure, higher parasitic capacitance exists between the word line and the bit line contact member; besides, the word line and the bit line contact member have a higher short-circuiting risk. In addition, as the size shrinks, this structure is more prone to the GIDL current and has a higher channel leakage risk.

Accordingly, an exemplary embodiment of the present disclosure provides a semiconductor structure. At least two dielectric layers are arranged between a word line and a substrate, and the dielectric layers have different dielectric constants. The dielectric layer with a high dielectric constant can reduce parasitic capacitance between the word line and a bit line contact member and also prevent a short-circuiting risk between the word line and the bit line contact member. In addition, a first work function layer 200 at least covers part of a side surface of a high-K layer 122, which can enhance a control capability of the word line for a channel region in the substrate and can effectively reduce the GIDL current between the word line and the active region to avoid breakdown caused by the GIDL current, thereby improving the reliability of the semiconductor structure.

Figure 2:
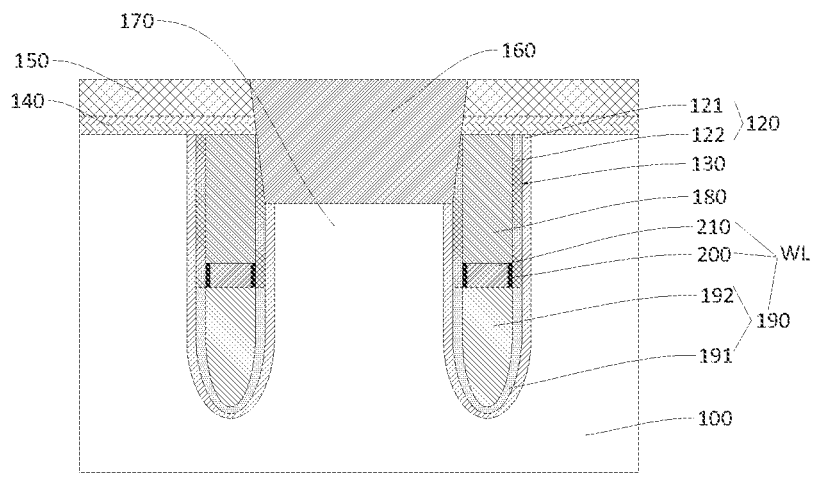
FIG. 2 is a schematic diagram of a semiconductor structure according to an exemplary embodiment.

An exemplary embodiment of the present disclosure provides a semiconductor structure. As shown in FIG. 2, the semiconductor structure includes a substrate 100, a word line WL, and at least two dielectric layers 120. The word line WL is arranged in the substrate 100. The at least two dielectric layers 120 are located between the word line WL and the substrate 100, and the at least two dielectric layers 120 have different dielectric constants.

For example, the substrate 100 may be a semiconductor substrate 100. A material of the semiconductor substrate 100 may include one or more of silicon (Si), germanium (Ge), silicon-germanium (GeSi), or silicon carbide (SiC); or silicon on insulator (SOI) or germanium on insulator (GeOI); or other materials such as gallium arsenide or other III-V compounds. The semiconductor substrate 100 may be doped with some impurity ions based on a requirement, and the impurity ions may be N-type impurity ions or P-type impurity ions.

At least two dielectric layers 120 are provided between the word line WL and the substrate 100. Two or more dielectric layers 120 may be provided. When two dielectric layers 120 are provided, the two dielectric layers 120 have different dielectric constants. When three or more dielectric layers 120 are provided, each dielectric layer 120 may have a different dielectric constant, or some of the dielectric layers 120 have a same dielectric constant.

In this embodiment, at least two dielectric layers 120 are arranged between the word line WL and the substrate 100, and each dielectric layer 120 has a different dielectric constant. The dielectric layers 120 with different dielectric constants can enhance a control capability of the word line WL for a channel region in the substrate 100 and can effectively reduce the GIDL current between the word line WL and the active region to avoid breakdown caused by the GIDL current, thereby improving the reliability of the semiconductor structure.

In an exemplary embodiment of the present disclosure, as shown in FIG. 2, the substrate 100 includes an active region, and the active region includes a source region (not shown in the figure), a drain region (not shown in the figure), and a channel region (not shown in the figure) between the source region and the drain region. The at least two dielectric layers 120 include a gate dielectric layer 121 at least covering the channel region. The word line WL covers a first region of the gate dielectric layer 121. The at least two dielectric layers 120 further include a high-K layer 122, where a dielectric constant of the high-K layer 122 is greater than a dielectric constant of the gate dielectric layer 121, and the high-K layer 122 covers a second region of the gate dielectric layer 121. It is understandable that, the high dielectric constant of the high-K layer 122 is relative to the dielectric constant of the gate dielectric layer 121.

In this embodiment, the high-K layer 122 is added based on the gate dielectric layer 121. The high-K layer 122 is arranged between the active region and the word line WL. While other parameters, such as a driving voltage of the word line WL, remain unchanged, the high-K layer 122 can effectively reduce the intensity of the electric field between the word line WL and the active region, thereby reducing the possibility of the GIDL current caused by tunneling. In addition, the high-K layer 122 can further reduce the parasitic capacitance between the word line WL and the bit line contact member 160. Besides, the high-K layer 122 can be formed as a gate oxide structure with low step coverage, which can enhance the control capability of the word line WL for the channel region, thereby improving the performance of semiconductor devices of the semiconductor structure.

For example, the dielectric constant of the high-K layer 122 is greater than 7, and the high-K layer 122 may include $HfSiO_2$, HfSiON, HfTaO, HfTiO, $HfO_2$, other suitable high-k material, or a combination thereof.

The word line WL may be formed on a surface of the substrate 100 or may be a buried word line WL.

In an embodiment, as shown in FIG. 2, a word line trench 110 is provided in the substrate 100. The gate dielectric layer 121 covers a sidewall and a bottom wall of the word line trench 110, and defines a cavity 130 in the word line trench 110. The word line WL is located in the cavity 130, and a top surface of the word line WL is lower than a top surface of the gate dielectric layer 121. The word line WL covers a bottom wall and part of a sidewall of the cavity 130, and the high-K layer 122 covers the other part of the sidewall of the cavity 130.

In this embodiment, the structure of the buried word line WL can improve the level of integration of the semiconductor structure and effectively increase the width and length of the channel. In addition, the word line WL and the high-K layer 122 jointly cover the gate dielectric layer 121, and the high-K layer 122 can immobilize positive charges. In this way, the gate dielectric layer 121 and the high-K layer 122 can jointly reduce the possibility of GIDL.

In an exemplary embodiment of the present disclosure, as shown in FIG. 2, the semiconductor structure further includes an isolation layer 140, a polysilicon layer 150, and a bit line contact member 160. The polysilicon layer 150 is stacked above the isolation layer 140, and a bottom surface of the isolation layer 140 is in contact with a top surface of the substrate 100. The bit line contact member 160 penetrates the isolation layer 140 and the polysilicon layer 150. A bottom surface of the bit line contact member 160 is in contact with the doped region 170 of the active region and the gate dielectric layer 121, and a side surface of the bit line contact member 160 is in contact with the high-K layer 122.

The doped region 170 may be the source region or the drain region. The bit line contact member 160 is configured to implement a connection between the bit line and the doped region 170. The bit line contact member 160 may be made of, for example, polysilicon doped with impurities or polysilicon not doped with impurities.

In this embodiment, the side surface of the bit line contact member 160 is in contact with the high-K layer 122. That is, the high-K layer 122 is added between the word line WL and the bit line contact member 160, thereby effectively avoiding short-circuiting between the word line WL and the bit line contact member 160 caused by the GIDL current.

In some embodiments, as shown in FIG. 2, the top surface of the word line WL is flush with the bottom surface of the high-K layer 122. In this way, the cavity 130 defined by the top surface of the word line WL and the side surface of the high-K layer 122 can be filled with a covering layer 180. In other embodiments, a partial structure of the word line WL extends into space between the side surfaces of the high-K layer 122.

In an exemplary embodiment of the present disclosure, as shown in FIG. 2, the word line WL includes a laminated structure 190 and a first work function layer 200. The laminated structure 190 covers the bottom wall and part of the sidewall of the cavity 130; the first work function layer 200 at least covers part of the side surface of the high-K layer 122. The laminated structure 190 may include an anti-diffusion layer 191 and a second metal conductive layer 192 arranged above the anti-diffusion layer 191. A top surface of the anti-diffusion layer 191 is in contact with the bottom surface of the high-K layer 122, and a top surface of the second metal conductive layer 192 is flush with the top surface of the anti-diffusion layer 191.

In this embodiment, the first work function layer 200 can implement effective regulation of the channel voltage.

For example, the anti-diffusion layer 191 may be made of one or a composite of at least two of the following metal nitrides: TiAlN, TaCN, TaSiN, TiN, or TaN.

In an embodiment, a material of the first work function layer 200 includes at least one from the group of titanium aluminum alloy, titanium nitride, tantalum nitride, or tantalum carbide.

For example, when a transistor to be formed is a P-type transistor, the first work function layer 200 is made of a P-type work function material, and the P-type work function material may be TaN, TiN, $ZrSi_2$, $MoSi_2$, $TaSi_2$, $NiSi_2$, other suitable P-type work function materials, or a combination thereof; when a transistor to be formed is an N-type transistor, the first work function layer 200 is made of an N-type work function material, and the N-type work function material includes TaAl, TaAlC, TiAlN, TaC, TaCN, TaSiN, titanium-aluminum alloy, other suitable N-type work function materials, or a combination thereof.

In an embodiment, as shown in FIG. 2, the first work function layer 200 covers part of the side surface of the high-K layer 122, and the word line WL further includes a first metal conductive layer 210. The first metal conductive layer 210 is arranged on the laminated structure 190, and has a bottom surface in contact with a top surface of the laminated structure 190 and a side surface in contact with the first work function layer 200.

In this embodiment, the first work function layer 200 is filled with the first metal conductive layer 210. The first metal conductive layer 210, the first work function layer 200, and the laminated structure 190 jointly form the word line WL, which can further enhance the control capability of the word line WL for the channel voltage. In addition, the first work function layer 200 can further avoid contact between the first metal conductive layer 210 and the high-K layer 122, to effectively prevent metal elements in the first metal conductive layer 210 from diffusing to the high-K layer 122.

For example, the first metal conductive layer 210 may be made of at least one or a combination of at least two of the following metal materials: tungsten, titanium, or tantalum. For example, the first metal conductive layer 210 and the second metal conductive layer 192 are made of a same material, to ensure the material uniformity and electrical uniformity of the word line WL, and it is unnecessary to arrange an isolation structure between the first metal conductive layer 210 and the second metal conductive layer 192. This helps reduce the contact resistance between the first metal conductive layer 210 and the second metal conductive layer 192, to reduce the overall resistance of the first metal conductive layer 210 and the second metal conductive layer 192, thereby reducing the loss and heating during circulation of the current and improving the performance of the buried word line WL.

It is understandable that, the first work function layer 200 may cover the entire side surface of the high-K layer 122, which is not limited in the present disclosure.

In an embodiment, a work function of the first work function layer 200 is greater than a work function of the anti-diffusion layer 191. The anti-diffusion layer 191 with a low work function can increase the saturation current. The first work function layer 200 with a high work function can ensure a relatively high sub-threshold voltage and reduce the intensity of the electric field between the word line WL and the active region, thereby reducing the GIDL current. In addition, because electrons tend to move the trench, movement of electrons can be effectively controlled without applying a high driving voltage.

In the semiconductor structure provided by an exemplary embodiment of the present disclosure, as shown in FIG. 2, the semiconductor structure further includes a covering layer 180. The covering layer 180 covers the top surface of the word line WL and the sidewall of the high-K layer 122. In some embodiments, a top surface of the covering layer 180 is flush with the top surface of the gate dielectric layer 121. The cavity 130 defined by the high-K layer 122 is filled with the covering layer 180, such that an isolation structure is formed between the word line WL and the bit line, and the word line WL under the covering layer 180 is also protected.

For example, the covering layer 180 may be made of silicon oxide, silicon nitride, or silicon oxynitride.

Figure 3:
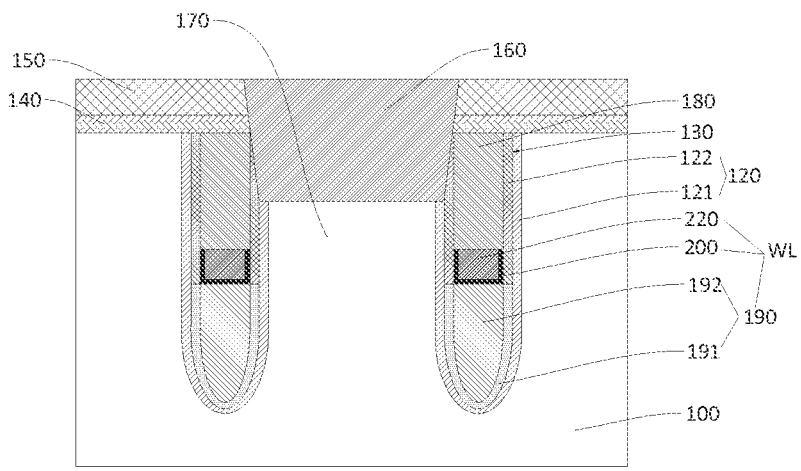
FIG. 3 is a schematic diagram of a semiconductor structure according to an exemplary embodiment.

An exemplary embodiment of the present disclosure provides a semiconductor structure. As shown in FIG. 3, the semiconductor structure includes a substrate 100, a word line trench 110 provided in the substrate 100, a gate dielectric layer 121 covering the word line trench 110, laminated structures 190 each covering part of a surface of the gate dielectric layer 121, and a high-K layer 122 covering another part of the surface of the gate dielectric layer 121. The foregoing structure is similar to the semiconductor structure in FIG. 2, and is not described in detail again. Different from the semiconductor structure shown in FIG. 2, in this embodiment, as shown in FIG. 3, the first work function layer 200 covers part of the side surface of the high-K layer 122 and the top surface of the laminated structure 190; the word line WL further includes a second work function layer 220, and space defined by the first work function layer 200 is filled with the second work function layer 220. The first work function layer 200 can implement effective regulation of the channel voltage on the one hand, and on the other hand, can avoid direct contact between the second work function layer 220 and the high-K layer 122 or the laminated structure 190, thereby avoiding element diffusion between the second work function layer 220 and the high-K layer 122 or the second metal conductive layer 192.

For example, a material of the second work function layer 220 may include doped polysilicon. That is, the second metal conductive layer 192 and the second work function layer 220 may be made of different materials. The second work function layer 220 containing polysilicon can improve the distribution of the electric field between the word line WL and the doped region 170. In other words, the second work function layer 220 and the second metal conductive layer 192 form a structure of a composite word line WL. The structure of the composite word line WL combines the advantages of the second metal conductive layer 192 and the second work function layer 220, which can reduce the GIDL current between the structure of the composite word line WL and the active region can be reduced while ensuring a low resistance value of the structure of the composite word line WL in the transistor.

Figure 4:
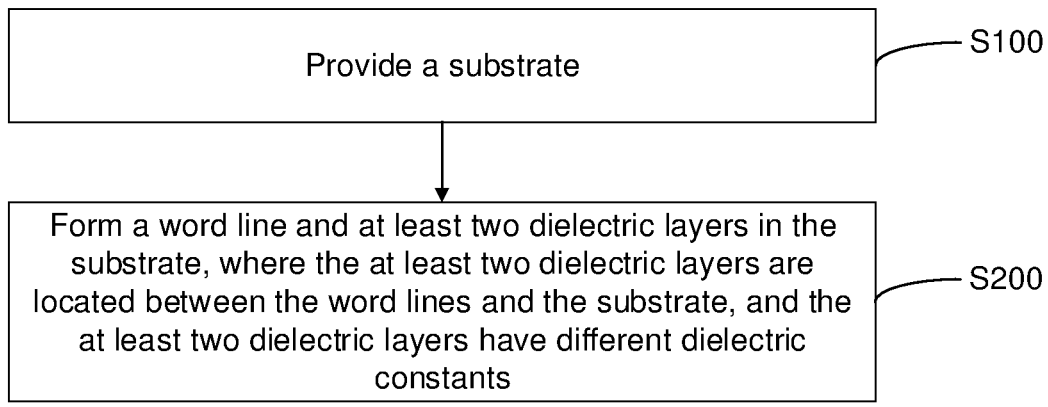
FIG. 4 is a flowchart of a method of manufacturing a semiconductor structure according to an exemplary embodiment.

An exemplary embodiment of the present disclosure provides a method of manufacturing a semiconductor structure, which is not limited to the semiconductor structure provided by the present disclosure. As shown in FIG. 4, the method of manufacturing a semiconductor structure includes:

Step S100: Provide a substrate.

The substrate 100 includes an active region provided with a doped region 170. The doped region 170 may be a source region or a drain region. For example, the substrate 100 may be a semiconductor substrate 100. A material of the semiconductor substrate 100 may include one or more of silicon (Si), germanium (Ge), silicon-germanium (SiGe), or silicon carbide (SiC), or other materials such as gallium arsenide or other III-V compounds.

Step S200: Form a word line and at least two dielectric layers in the substrate, where the at least two dielectric layers are located between the word line and the substrate, and the at least two dielectric layers have different dielectric constants.

For example, some of the at least two dielectric layers 120 may be formed first, then the word line WL is formed, and then the remaining dielectric layers 120 are formed. Alternatively, part of the at least two dielectric layers 120 may be formed, then part of the word line WL is formed, the other part of the dielectric layers 120 are formed next, and finally the other part of the word line WL is formed. That is, the forming process of the word line WL and the forming process of the dielectric layers 120 may be performed alternately, and the forming sequence of the word line WL and the dielectric layers 120 is not limited, provided that two dielectric layers 120 and the word line WL can be formed in the end.

In this embodiment, as shown in FIG. 2, at least two dielectric layers 120 are arranged between the word line WL and the substrate 100, and each dielectric layer 120 has a different dielectric constant. The dielectric layers 120 with different dielectric constants can enhance a control capability of the word line WL for a channel region in the substrate 100 and can effectively reduce the GIDL current between the word line WL and the active region to avoid breakdown caused by the GIDL current, thereby improving the reliability of the semiconductor structure.

Figure 5:
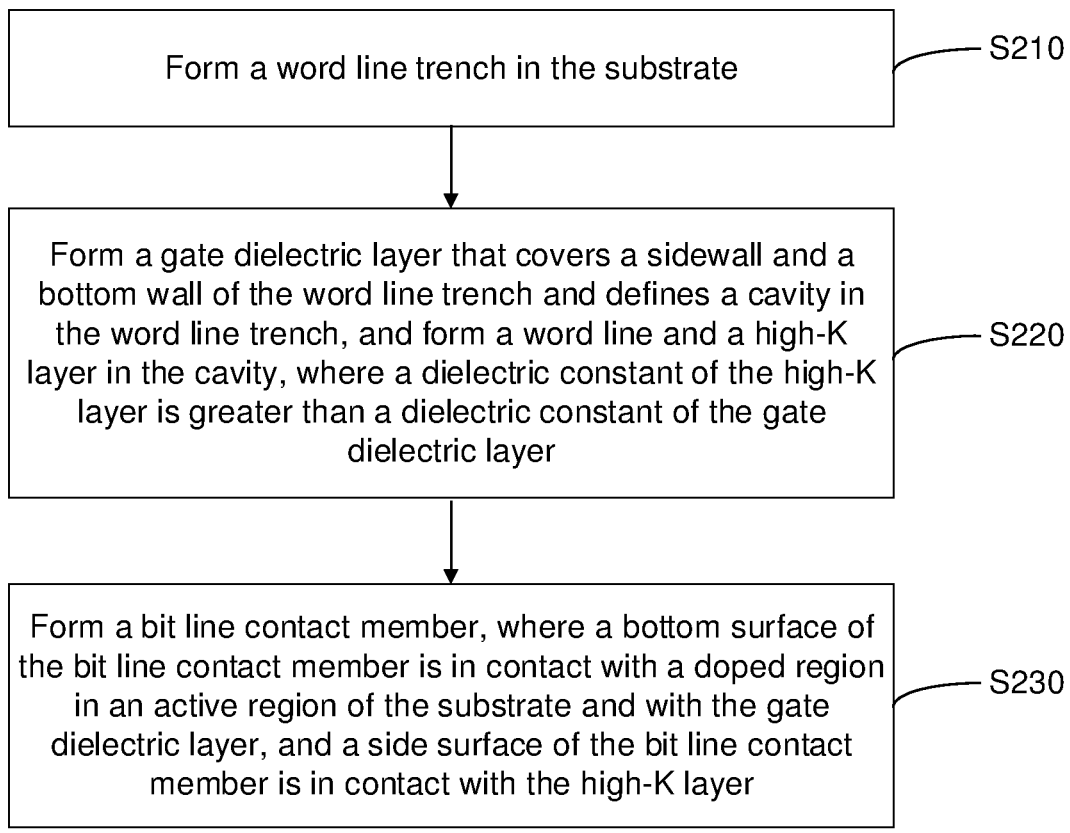
FIG. 5 is a flowchart of a method of manufacturing a semiconductor structure according to an exemplary embodiment.

An exemplary embodiment of the present disclosure provides a method of manufacturing a semiconductor structure. As shown in FIG. 5, step S200 of the manufacturing method specifically includes:

Step S210: Form a word line trench in the substrate.

Figure 8:
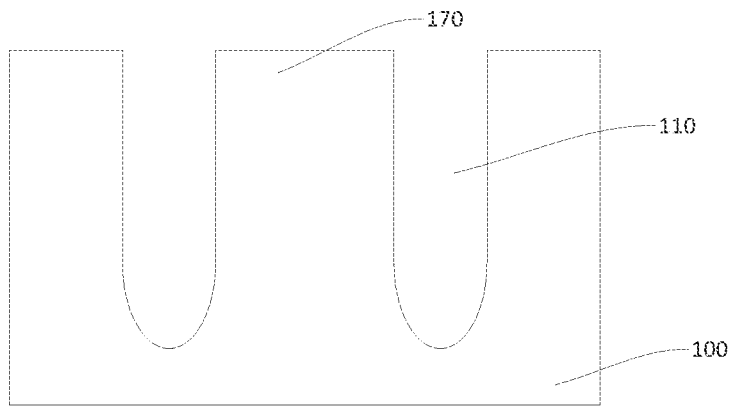
FIG. 8 is a schematic diagram of forming a word line trench in a method of manufacturing a semiconductor structure according to an exemplary embodiment.

As shown in FIG. 8, a word line trench 110 is formed in the substrate 100. The word line trench 110 is used for forming a gate dielectric layer 121, a high-K layer 122, and a word line WL in the subsequent process. The word line trench 110 may be formed through lithography, etching, or the like.

For example, a plurality of active regions are provided in the substrate 100, and the formed word line trench 110 is located in the active region.

Step S220: Form a gate dielectric layer that covers a sidewall and a bottom wall of the word line trench and defines a cavity in the word line trench, and form a word line and a high-K layer in the cavity.

Figure 18:
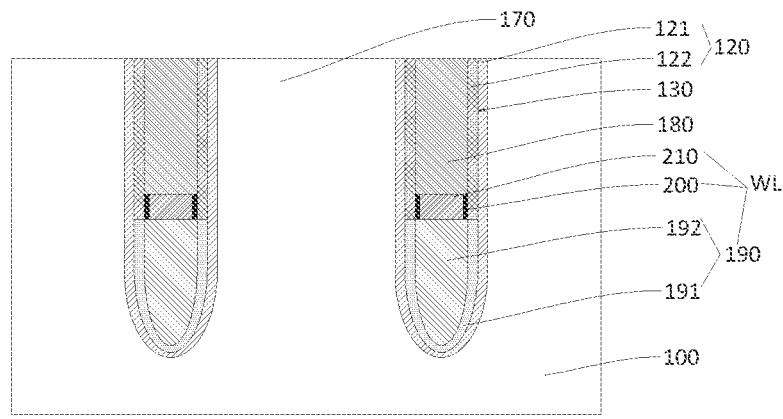
FIG. 18 is a schematic diagram of forming a covering layer, a high-K layer, and a gate dielectric layer in a method of manufacturing a semiconductor structure according to an exemplary embodiment.
Figure 28:
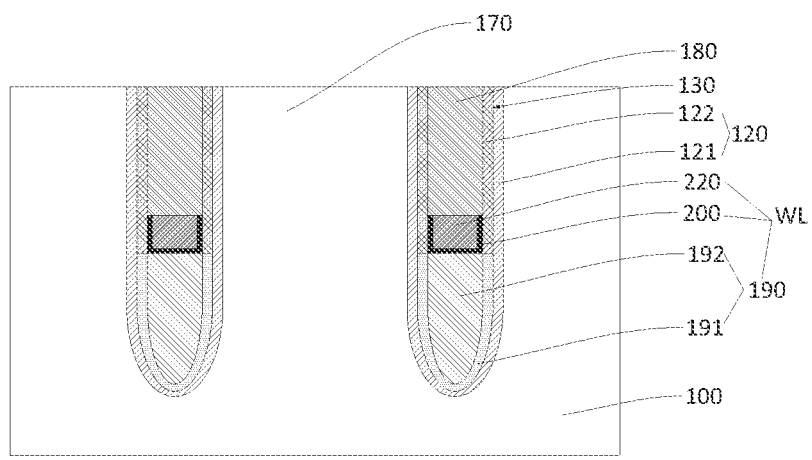
FIG. 28 is a schematic diagram of forming a covering layer in a method of manufacturing a semiconductor structure according to another exemplary embodiment.

As shown in FIG. 2, the gate dielectric layer 121 covers the bottom wall and the sidewall of the word line trench 110 and defines the cavity 130 in the word line trench 110. The word line WL covers a bottom wall and part of a sidewall of the cavity 130, and a top surface of the word line WL is lower than a top surface of the gate dielectric layer 121. The high-K layer 122 covers the other part of the sidewall of the cavity 130. In this step, as shown in FIG. 18 and FIG. 28, the gate dielectric layer 121 may be formed in the word line trench 110 through physical vapor deposition (PVD), atomic layer deposition (ALD), chemical vapor deposition (CVD) or the like.

For example, the gate dielectric layer 121 includes one or more layers of a dielectric material. The gate dielectric layer 121 may be made of, for example, silicon oxide, titanium nitride, or silicon nitride. After the gate dielectric layer 121 is formed, part of the sidewall of the gate dielectric layer 121 is covered by the high-K layer 122, and the high-K layer 122 has a dielectric constant greater than 7.

For example, the high-K layer 122 may be a single-layer structure or a multi-layer structure. When the high-K layer 122 is a multi-layer structure, each layer in the high-K layer 122 may be made of a same or different material. The high-K layer 122 may be made of $HfSiO_2$, HfSiON, HfTaO, HfTiO, $HfO_2$, or the like.

Step S230: Form a bit line contact member, where a bottom surface of the bit line contact member is in contact with a doped region in an active region of the substrate and the gate dielectric layer, and a side surface of the bit line contact member is in contact with the high-K layer.

Figure 19:
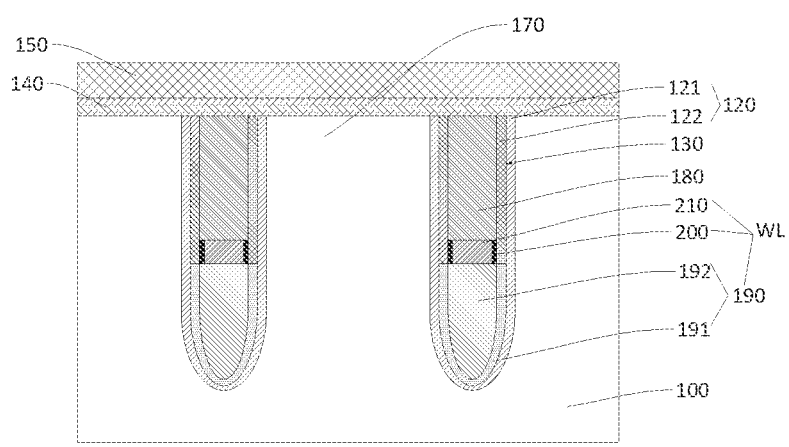
FIG. 19 is a schematic diagram of forming a bit line in a method of manufacturing a semiconductor structure according to an exemplary embodiment.
Figure 20:
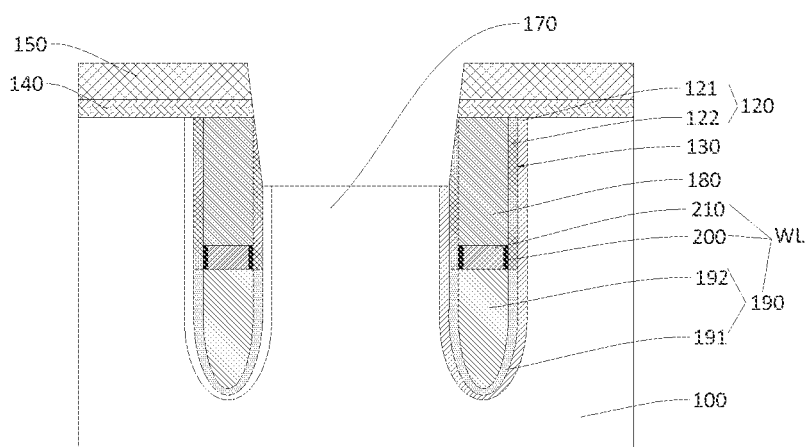
FIG. 20 is a schematic diagram of forming a bit line trench in a method of manufacturing a semiconductor structure according to an exemplary embodiment.
Figure 29:
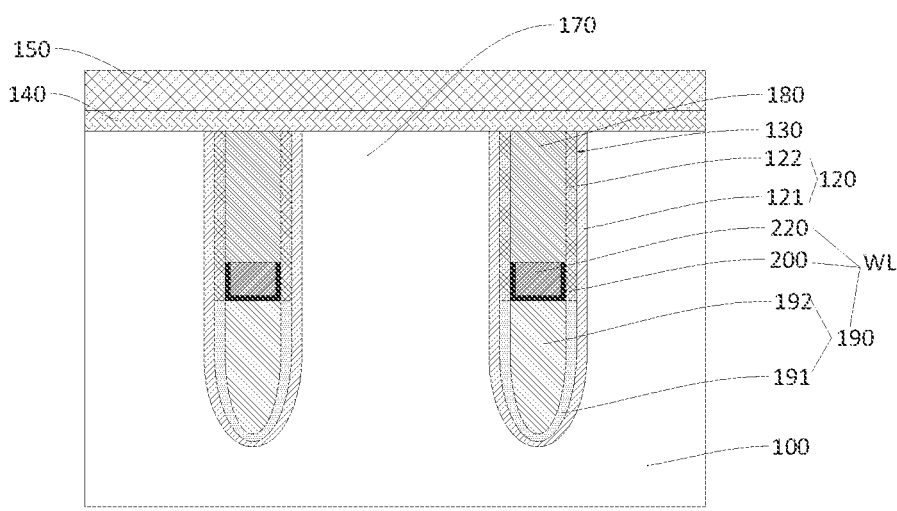
FIG. 29 is a schematic diagram of forming a bit line in a method of manufacturing a semiconductor structure according to another exemplary embodiment.
Figure 30:
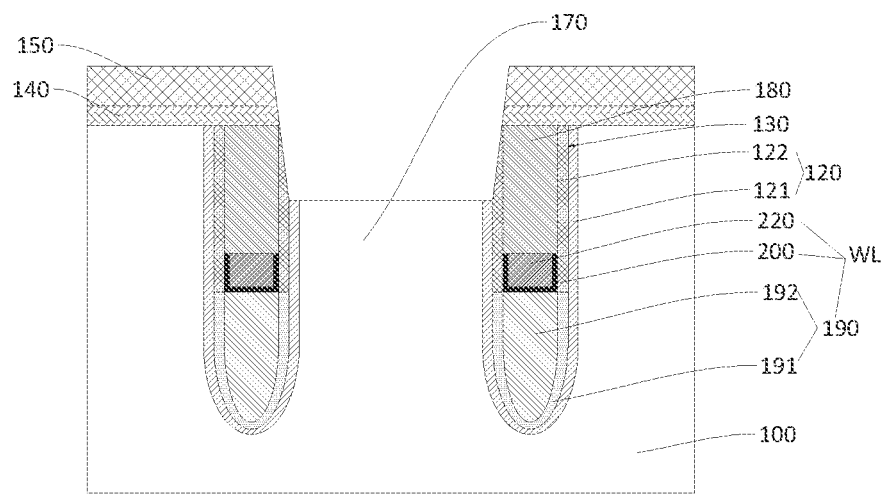
FIG. 30 is a schematic diagram of forming a bit line trench in a method of manufacturing a semiconductor structure according to another exemplary embodiment.

The doped region 170 may be the source region or the drain region. As shown in FIG. 19 and FIG. 29, an isolation layer 140 and a polysilicon layer 150 may be sequentially formed on the surface of the substrate 100 through physical vapor deposition (PVD), atomic layer deposition (ALD), chemical vapor deposition (CVD) or the like. The polysilicon layer 150 is stacked above the isolation layer 140, and a bottom surface of the isolation layer 140 is in contact with a top surface of the substrate 100. As shown in FIG. and FIG. 30, a bit line trench is formed on the isolation layer 140 and the polysilicon layer 150 through lithography. As shown in FIG. 2 and FIG. 3, the bit line contact member 160 may be formed in the bit line trench through the same deposition process. The bit line contact member 160 is used for implementing a connection between the bit line and the doped region 170. The bottom surface of the formed bit line contact member 160 is in contact with the doped region 170 of the active region and the gate dielectric layer 121, and the side surface of the bit line contact member 160 is in contact with the high-K layer 122. The bit line contact member 160 may be made of polysilicon doped with impurities or polysilicon not doped with impurities.

For example, as shown in FIG. 2 and FIG. 3, a cross section of the bit line contact member 160 may be in the shape of a trapezoid, or may be in another shape as required, which is not limited in this embodiment.

In this embodiment, the high-K layer 122 is added based on the gate dielectric layer 121. While other parameters, such as the driving voltage of the word line WL, remain unchanged, the high-K layer 122 arranged between the active region and the word line WL effectively reduces the intensity of the electric field between the word line WL and the active region, thereby reducing the possibility of the GIDL current caused by tunneling. In addition, the high-K layer 122 can further reduce the parasitic capacitance between the word line WL and the bit line contact member 160. Besides, the high-K layer 122 can be formed as a gate oxide structure with low step coverage, which can enhance the control capability of the word line WL for the channel region, thereby improving the performance of semiconductor devices of the semiconductor structure.

Figure 6:
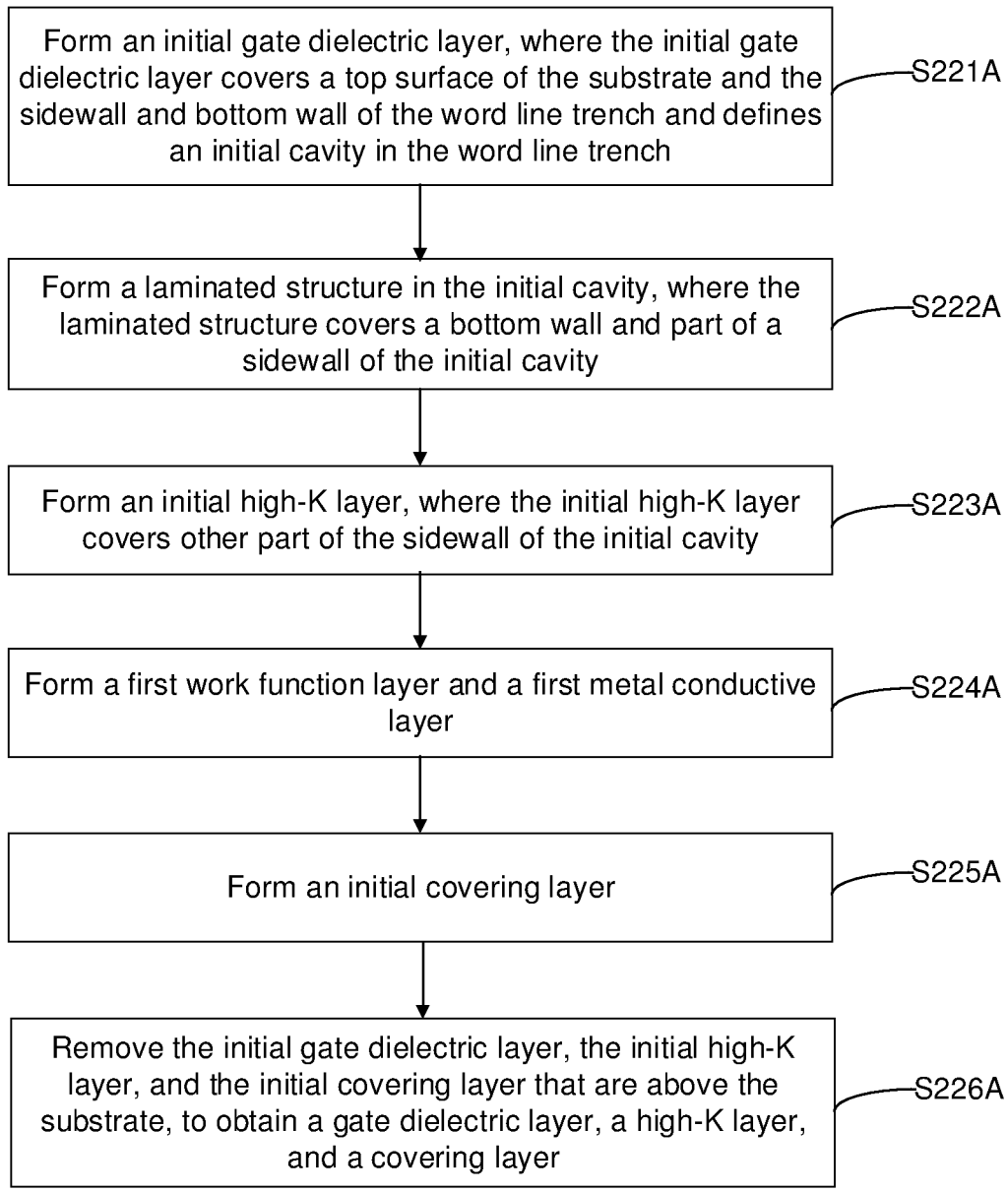
FIG. 6 is a flowchart of a method of manufacturing a semiconductor structure according to an exemplary embodiment.

As shown in FIG. 6, step S220 specifically includes:

Step S221A: Form an initial gate dielectric layer, where the initial gate dielectric layer covers a top surface of the substrate and the sidewall and bottom wall of the word line trench and defines an initial cavity in the word line trench.

Figure 9:
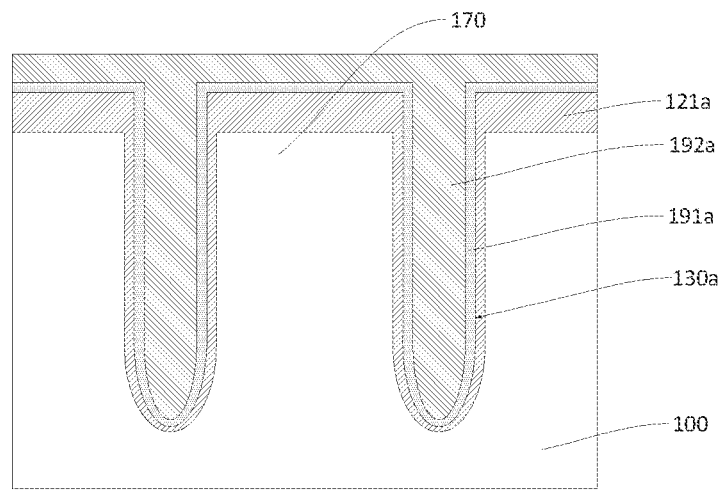
FIG. 9 is a schematic diagram of forming an initial gate dielectric layer, an initial anti-diffusion layer, and a second initial metal conductive layer in a method of manufacturing a semiconductor structure according to an exemplary embodiment.

For example, the initial gate dielectric layer 121a may be formed in the word line trench 110 through physical vapor deposition (PVD), atomic layer deposition (ALD), chemical vapor deposition (CVD) or the like. As shown in FIG. 9, the initial gate dielectric layer 121a covers the top surface of the substrate 100 and the sidewall and bottom wall of the word line trench 110, and defines the initial cavity 130a in the word line trench 110. The initial cavity 130a is used for accommodating the laminated structure 190 formed in the subsequent step.

Step S222A: Form a laminated structure in the initial cavity, where the laminated structure covers a bottom wall and part of a sidewall of the initial cavity.

Figure 10:
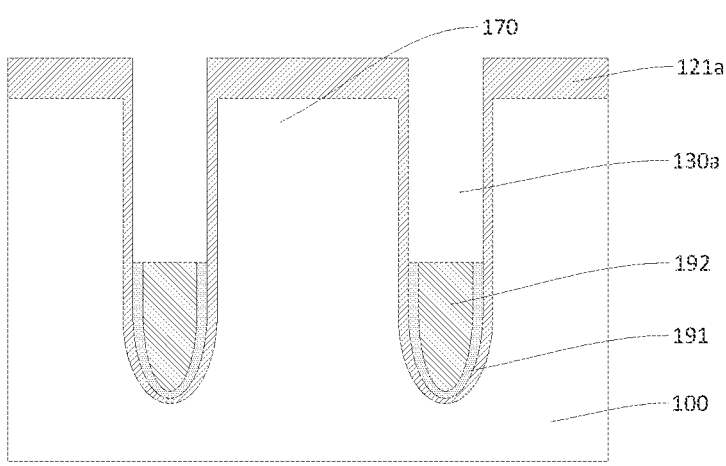
FIG. 10 is a schematic diagram of forming laminated structures in a method of manufacturing a semiconductor structure according to an exemplary embodiment.

As shown in FIG. 10, a top surface of the laminated structure 190 is lower than the top surfaces of the substrate 100 and the gate dielectric layer 121. For example, the laminated structure 190 includes an anti-diffusion layer 191 and a second metal conductive layer 192. The anti-diffusion layer 191 covers the bottom wall and part of the sidewall of the cavity 130. Space defined by the anti-diffusion layer 191 is filled with the second metal conductive layer 192, and a top surface of the second metal conductive layer 192 is flush with a top surface of the anti-diffusion layer 191.

As shown in FIG. 9, an unpatterned initial anti-diffusion layer 191a may be first formed through atomic layer deposition (ALD), chemical vapor deposition (CVD) or the like. The initial anti-diffusion layer 191a covers the initial gate dielectric layer 121a. A second initial metal conductive layer 192a may be deposited on the initial anti-diffusion material layer through the same deposition process. The second initial metal conductive layer 192a covers the initial anti-diffusion layer 191a and fills up space defined by the initial anti-diffusion layer 191a in the initial cavity 130a. Then, as shown in FIG. 10, the initial anti-diffusion layer 191a and the second initial metal conductive layer 192a are etched back to form the anti-diffusion layer 191 and the second metal conductive layer 192. The anti-diffusion layer 191 may be made of one or a composite of at least two of the following metal nitrides: TiAlN, TaCN, TaSiN, TiN, or TaN. The second metal conductive layer 192 may be made of one or a composite of at least two of the following metal materials: tungsten, titanium, or tantalum.

Step S223A: Form an initial high-K layer, where the initial high-K layer covers other part of the sidewall of the initial cavity.

Figure 11:
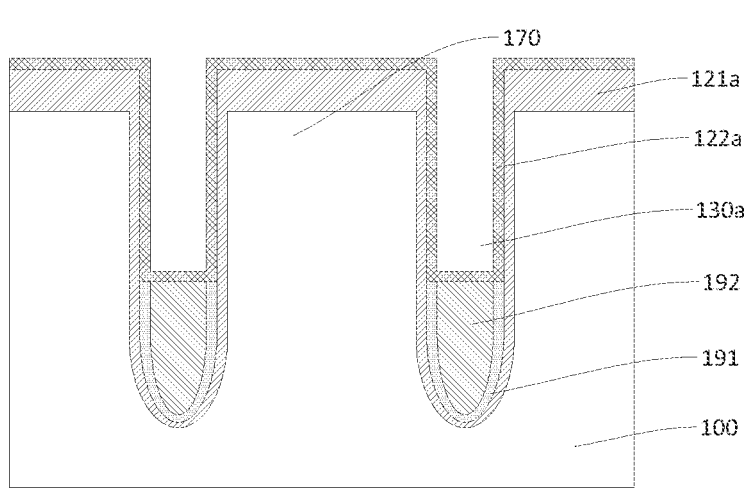
FIG. 11 is a schematic diagram of forming an unpatterned initial high-K layer in a method of manufacturing a semiconductor structure according to an exemplary embodiment.
Figure 12:
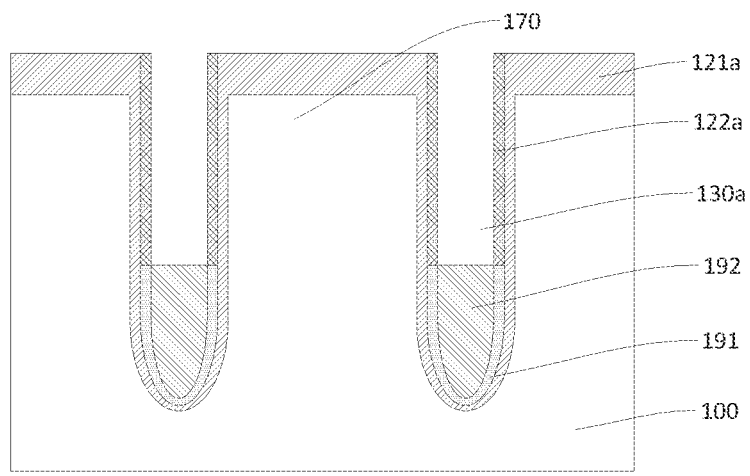
FIG. 12 is a schematic diagram of forming an initial high-K layer in a method of manufacturing a semiconductor structure according to an exemplary embodiment.

As shown in FIG. 11, before the initial high-K layer 122a is formed, an unpatterned initial high-K layer 122a may be formed through a deposition process such as atomic layer deposition (ALD) or chemical vapor deposition (CVD). As shown in FIG. 12, the unpatterned initial high-K layer 122a is etched back to form the initial high-K layer 122a. A top surface of the initial high-K layer 122a may be flush with a top surface of the initial gate dielectric layer 121a. The anti-diffusion layer 191 covers part of the sidewall of the initial cavity 130a, and the formed initial high-K layer 122a covers the other part of the sidewall of the initial cavity 130a.

For example, the initial high-K layer 122a has a dielectric constant greater than 7. The initial high-K layer 122a may be made of $HfSiO_2$, HfSiON, HfTaO, HfTiO, $HfO_2$, $HfO_2$—$Al_2O_3$, or a combination thereof.

Step S224A: Form a first work function layer and a first metal conductive layer.

Figure 13:
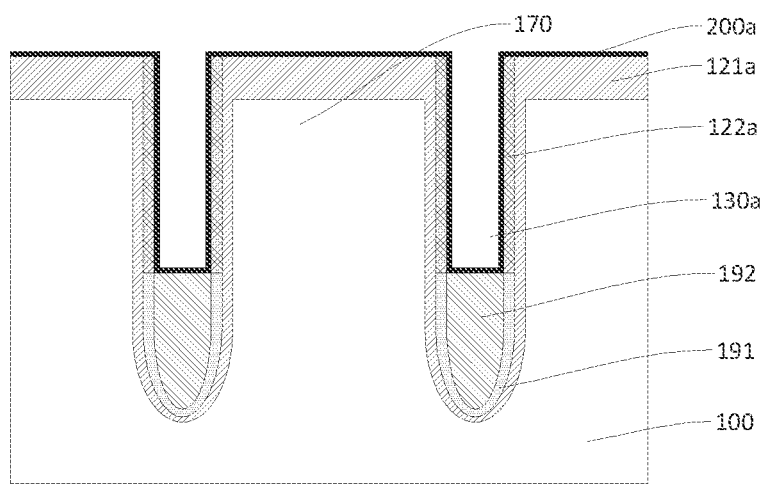
FIG. 13 is a schematic diagram of forming a first initial work function layer in a method of manufacturing a semiconductor structure according to an exemplary embodiment.
Figure 14:
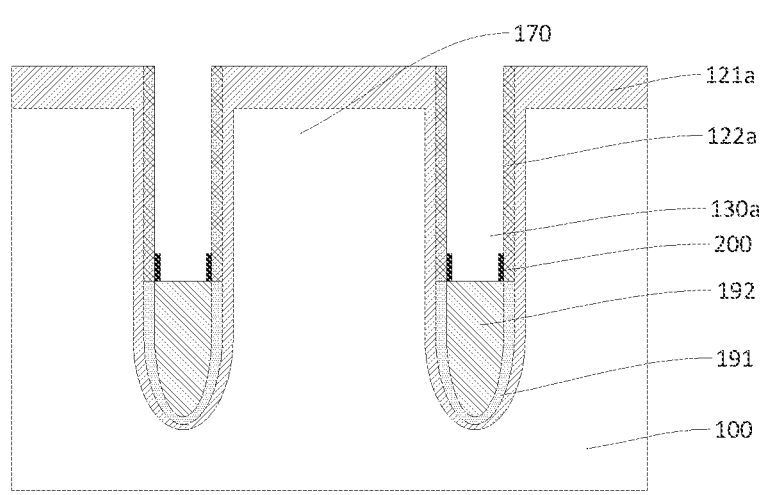
FIG. 14 is a schematic diagram of forming a first work function layer in a method of manufacturing a semiconductor structure according to an exemplary embodiment.
Figure 15:
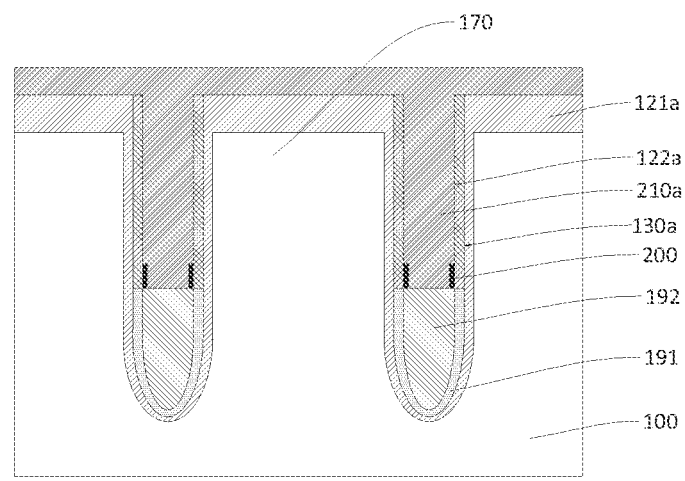
FIG. 15 is a schematic diagram of forming a first initial metal conductive layer in a method of manufacturing a semiconductor structure according to an exemplary embodiment.
Figure 16:
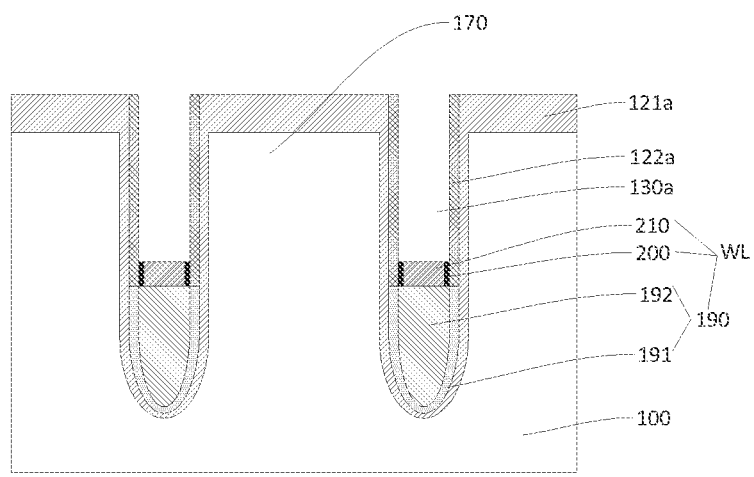
FIG. 16 is a schematic diagram of forming a first metal conductive layer in a method of manufacturing a semiconductor structure according to an exemplary embodiment.

As shown in FIG. 13, after the initial high-K layer 122a is formed, an unpatterned first initial work function layer 200a may be formed through a deposition process. The first initial work function layer 200a covers a side surface of the initial high-K layer 122a, the top surface of the initial gate dielectric layer 121a, and the top surface of the laminated structure 190. As shown in FIG. 14, the first initial work function layer 200a covering the top surface of the laminated structure 190, covering the top surface of the initial gate dielectric layer 121a, and covering part of the side surface of the initial high-K layer 122a may be removed through back etching, while the first initial work function layer 200a covering another part of the side surface of the initial high-K layer 122a is retained, to form the first work function layer 200. As shown in FIG. 15, a first initial metal conductive layer 210a covering the side surface of the initial high-K layer 122a and the top surface of the initial gate dielectric layer 121a is formed between the first work function layers 200. As shown in FIG. 16, part of the first initial metal conductive layer 210a may be removed through back etching, while the first initial metal conductive layer 210a between the first work function layers 200 is retained to form the first metal conductive layer 210.

For example, when a transistor to be formed is a P-type transistor, the first work function layer 200 is made of a P-type work function material, and the P-type work function material may be TaN, TiN, $ZrSi_2$, $MoSi_2$, $TaSi_2$, $NiSi_2$, other suitable P-type work function materials, or a combination thereof; when a transistor to be formed is an N-type transistor, the first work function layer 200 is made of an N-type work function material, and the N-type work function material includes TaAl, TaAlC, TiAlN, TaC, TaCN, TaSiN, other suitable N-type work function materials, or a combination thereof.

For example, the first metal conductive layer 210 and the second metal conductive layer 192 are made of a same material, to ensure the material uniformity and electrical uniformity of the word line WL, and it is unnecessary to arrange an isolation structure between the first metal conductive layer 210 and the second metal conductive layer 192. This helps reduce the contact resistance between the first metal conductive layer 210 and the second metal conductive layer 192, to reduce the overall resistance of the first metal conductive layer 210 and the second metal conductive layer 192, thereby reducing the loss and heating during circulation of the current and improving the performance of the buried word line WL.

In an embodiment, a work function of the first work function layer 200 is greater than a work function of the anti-diffusion layer 191. The anti-diffusion layer 191 with a low work function can increase the saturation current. The first work function layer 200 with a high work function can ensure a relatively high sub-threshold voltage and reduce the intensity of the electric field between the word line WL and the active region, thereby reducing the GIDL current. In addition, because electrons tend to move the trench, movement of electrons can be effectively controlled without applying a high driving voltage.

Step S225A: Form an initial covering layer.

Figure 17:
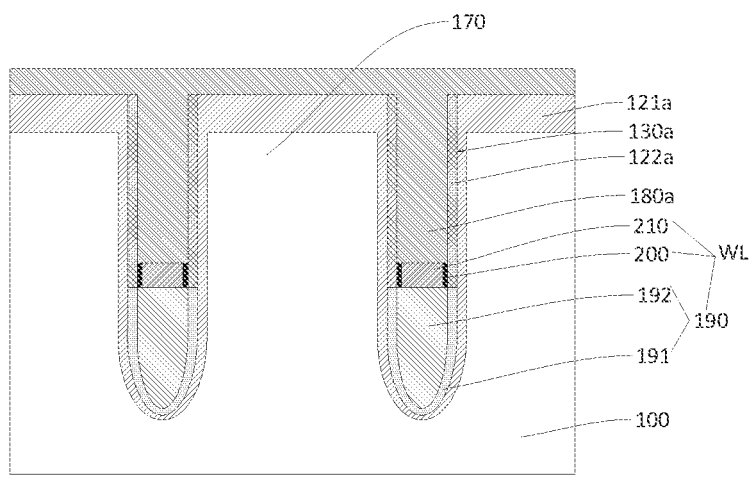
FIG. 17 is a schematic diagram of forming an initial covering layer in a method of manufacturing a semiconductor structure according to an exemplary embodiment.

As shown in FIG. 17, an unpatterned initial covering layer 180a may be formed through a deposition process such as atomic layer deposition (ALD) or chemical vapor deposition (CVD). The unpatterned initial covering layer 180a covers the top surface of the initial gate dielectric layer 121a and fills up space defined by the initial high-K layer 122a. The unpatterned initial covering layer 180a is etched back to form an initial covering layer 180a, where a top surface of the initial covering layer 180a is flush with the top surface of the initial gate dielectric layer 121a.

For example, the initial covering layer 180a may be made of silicon oxide, silicon nitride, or silicon oxynitride.

Step S226A: Remove the initial gate dielectric layer, the initial high-K layer, and the initial covering layer that are above the substrate, to obtain a gate dielectric layer, a high-K layer, and a covering layer.

For example, as shown in FIG. 18, the initial gate dielectric layer 121a, the initial high-K layer 122a, and the initial covering layer 180a may be planarized through chemical mechanical polishing (CMP) or other planarization processes, to obtain the gate dielectric layer 121, the high-K layer 122, and the covering layer 180.

In this embodiment, the high-K layer 122, the covering layer 180, and the structure of the word line WL are formed by using the initial gate dielectric layer 121a as a protective layer. In the foregoing process, the initial gate dielectric layer 121a protects the top surface of the substrate 100, to avoid problems such as damage or denting on the top surface of the substrate 100. In addition, the formed first work function layer 200 can achieve effective regulation of the channel voltage and can further avoid direct contact between the first metal conductive layer 210 and the high-K layer 122, to effectively prevent metal elements in the first metal conductive layer 210 from diffusing to the high-K layer 122. The formed high-K layer 122 can further reduce the parasitic capacitance between the word line WL and the bit line contact member 160. Besides, the high-K layer 122 can be formed as a gate oxide structure with low step coverage, which can enhance the control capability of the word line WL for the channel region, thereby improving the performance of semiconductor devices of the semiconductor structure.

In other embodiments, the initial gate dielectric layer 121a may be planarized after the initial gate dielectric layer 121a is formed, so as to obtain the gate dielectric layer 121. Then, subsequent steps of forming the high-K layer 122, the covering layer 180, and the structure of the word line WL are performed, where the top surface of the formed gate dielectric layer 121 may be flush with the top surface of the substrate 100.

Figure 7:
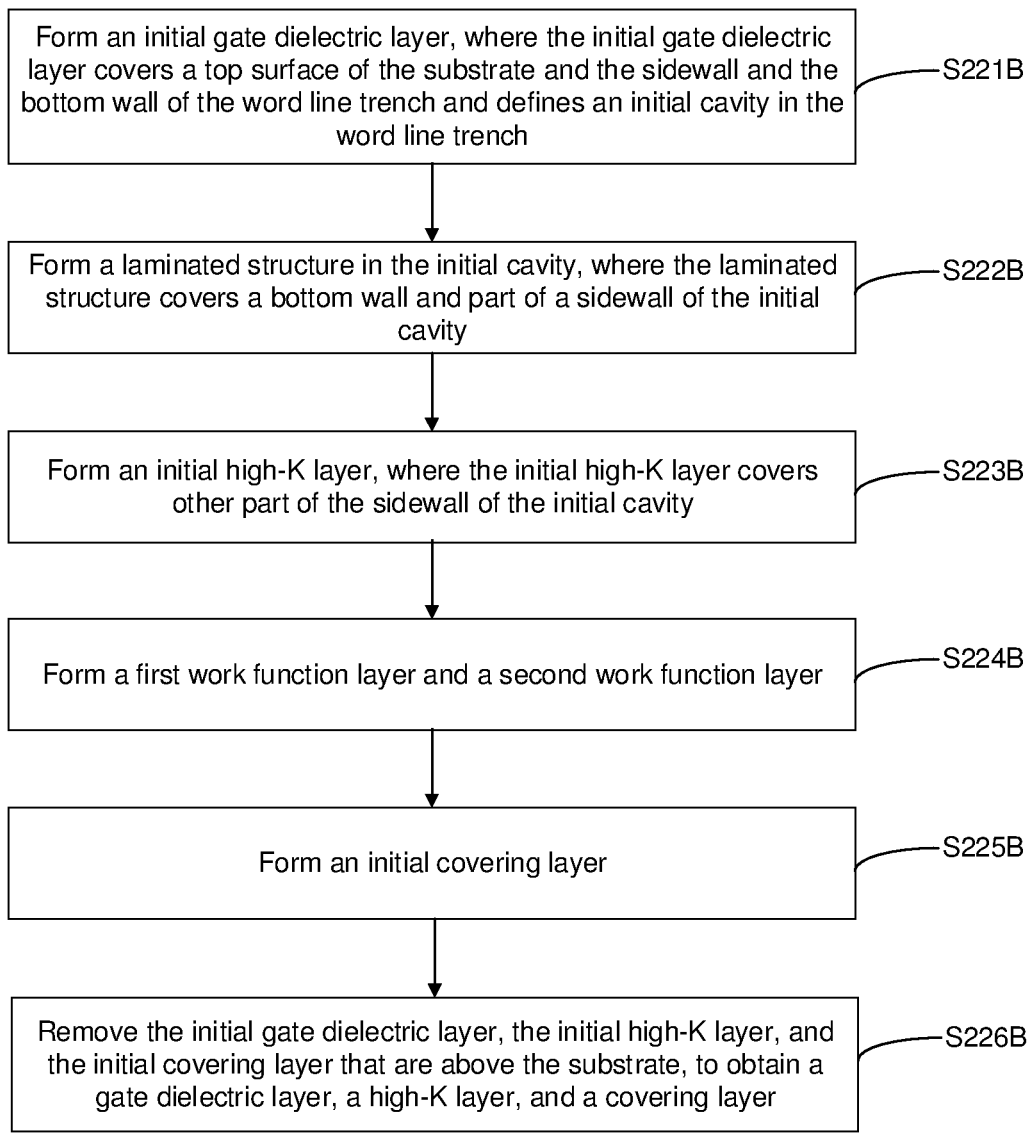
FIG. 7 is a flowchart of a method of manufacturing a semiconductor structure according to an exemplary embodiment.

In another exemplary embodiment of the present disclosure, as shown in FIG. 7, step S220 specifically includes:

Step S221B: Form an initial gate dielectric layer, where the initial gate dielectric layer covers a top surface of the substrate and the sidewall and the bottom wall of the word line trench and defines an initial cavity in the word line trench.

The initial gate dielectric layer 121a shown in FIG. 9 is formed through this step Step S222B: Form a laminated structure in the initial cavity, where the laminated structure covers a bottom wall and part of a sidewall of the initial cavity.

The structure is as shown in FIG. 10 after the laminated structure 190 is formed.

Step S223B: Form an initial high-K layer, where the initial high-K layer covers other part of the sidewall of the initial cavity.

The structure formed through this step is as shown in FIG. 12.

In this embodiment, step S221B, step S222B, and step S223B are the same as the foregoing step S221A, step S222A, and step S223A, and will not be described in detail again herein.

Step S224B: Form a first work function layer and a second work function layer.

Figure 21:
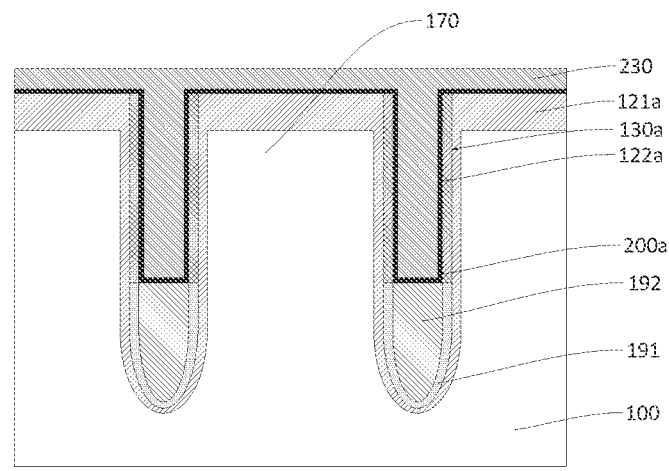
FIG. 21 is a schematic diagram of forming a sacrificial layer in a method of manufacturing a semiconductor structure according to another exemplary embodiment.
Figure 22:
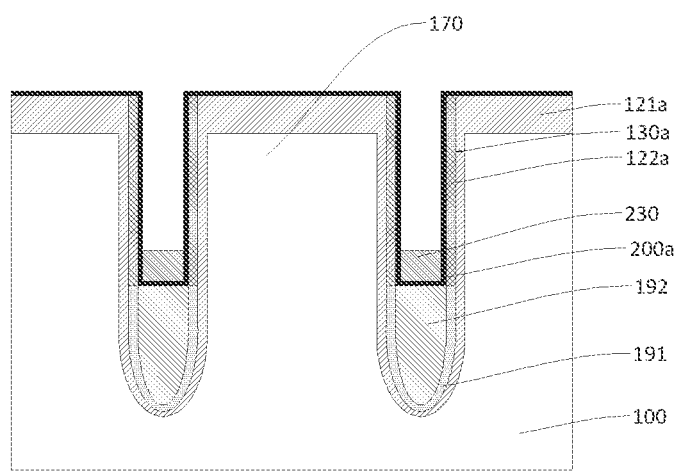
FIG. 22 is a schematic diagram of forming a sacrificial layer in a method of manufacturing a semiconductor structure according to another exemplary embodiment.
Figure 23:
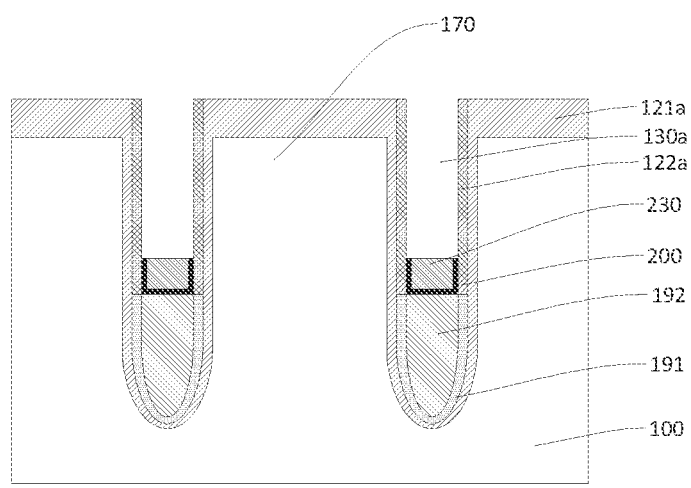
FIG. 23 is a schematic diagram of forming a first work function layer in a method of manufacturing a semiconductor structure according to another exemplary embodiment.
Figure 24:
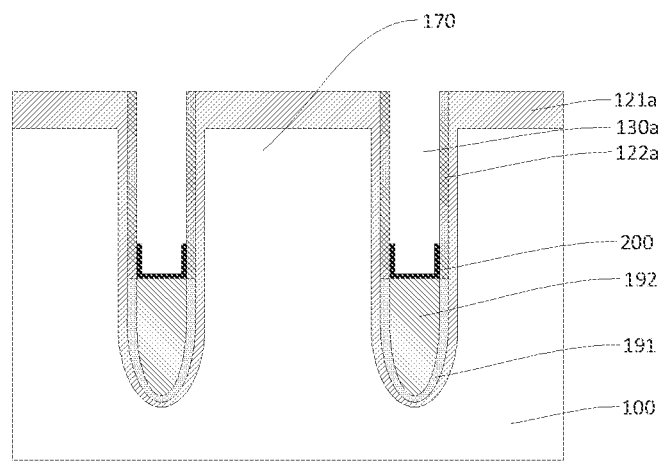
FIG. 24 is a schematic diagram of removing a sacrificial layer in a method of manufacturing a semiconductor structure according to another exemplary embodiment.
Figure 25:
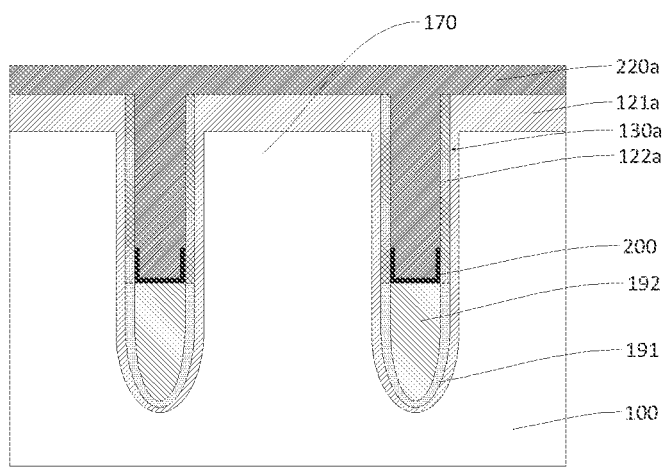
FIG. 25 is a schematic diagram of forming a second initial work function layer in a method of manufacturing a semiconductor structure according to another exemplary embodiment.
Figure 26:
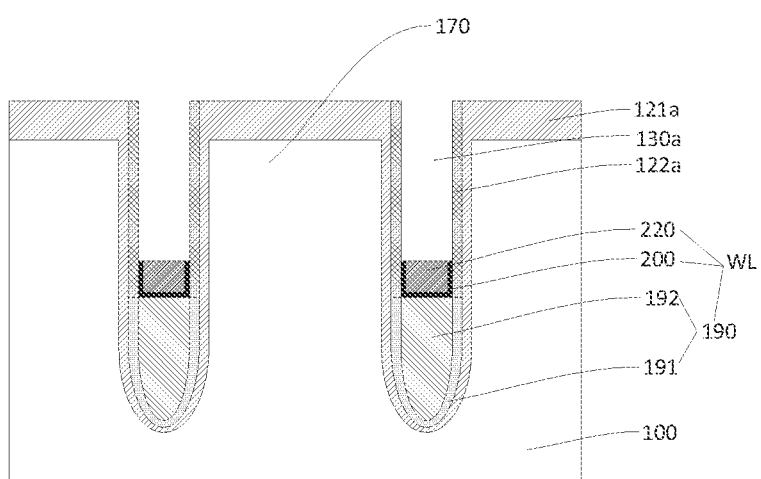
FIG. 26 is a schematic diagram of forming a second work function layer in a method of manufacturing a semiconductor structure according to another exemplary embodiment.

As shown in FIG. 13, after the initial high-K layer 122a is formed, a first work function material layer covering a side surface of the initial high-K layer 122a, a top surface of the initial gate dielectric layer 121a, and the top surface of the laminated structure 190 is formed through deposition. After the first work function material layer is formed, as shown in FIG. 21, a sacrificial layer 230 is formed through deposition. The sacrificial layer 230 covers the initial high-K layer 122a and fills up space defined by the initial high-K layer 122a in the word line trench 110, where the sacrificial layer 230 may be made of SiN. As shown in FIG. 22, the sacrificial layer 230 is etched back, such that a top surface of the sacrificial layer 230 is lower than the top surface of the substrate 100. As shown in FIG. 23, the first work function material layer is then etched back to be flush with the top surface of the sacrificial layer 230, to form the first work function layer 200. As shown in FIG. 24, after the first work function layer 200 is formed, the sacrificial layer 230 is removed. As shown in FIG. 25, after the sacrificial layer 230 is removed, the second work function layer 220 is formed in the space defined by the first work function layer 200. For example, an unpatterned second initial work function layer 220a may be formed through atomic layer deposition or chemical vapor deposition, as shown in FIG. 26. Then, part of the second initial work function layer 220a is removed through back etching, while the second initial work function layer 220a in the space defined by the first work function layer 200 is retained to obtain the second work function layer 220.

For example, the second work function layer may be made of polysilicon doped with impurities, polysilicon not doped with impurities. That is, the second metal conductive layer 192 and the second work function layer 220 may be made of different materials. The second work function layer 220 containing polysilicon can improve the distribution of the electric field between the word line WL and the doped region 170. In other words, the second work function layer 220 and the second metal conductive layer 192 form a structure of a composite word line WL. The structure of the composite word line WL combines the advantages of the second metal conductive layer 192 and the second work function layer 220, which can reduce the GIDL current between the structure of the composite word line WL and the active region can be reduced while ensuring a low resistance value of the structure of the composite word line WL in the transistor.

Step S225B: Form an initial covering layer.

Figure 27:
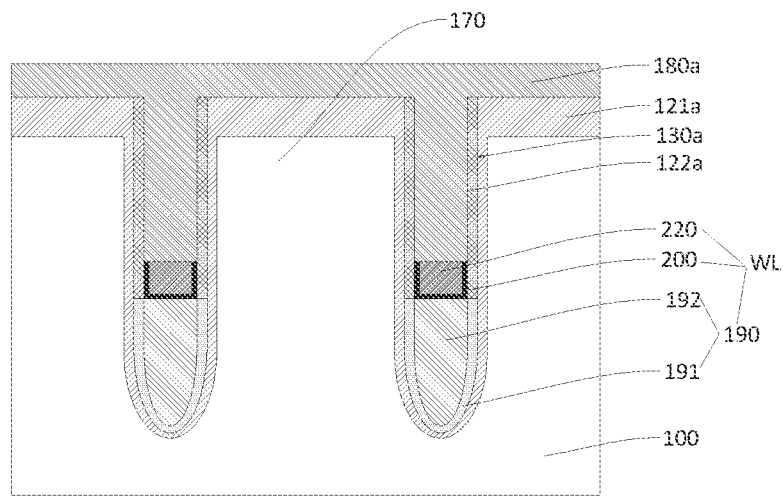
FIG. 27 is a schematic diagram of forming an initial covering layer in a method of manufacturing a semiconductor structure according to another exemplary embodiment.

The initial covering layer 180a formed after this step is as shown in FIG. 27.

Step S226B: Remove the initial gate dielectric layer, the initial high-K layer, and the initial covering layer that are above the substrate, to obtain a gate dielectric layer, a high-K layer, and a covering layer.

The structure obtained after this step is as shown in FIG. 28.

In this embodiment, step S225B and step S226B are the same as the foregoing step S225A and step S226A, and will not be described in detail again herein.

In this embodiment, the first work function layer 200 can implement effective regulation of the channel voltage on the one hand, and on the other hand, can avoid direct contact between the second work function layer 220 and the high-K layer 122 or the laminated structure 190, thereby avoiding element diffusion between the second work function layer 220 and the high-K layer 122 or the second metal conductive layer 192.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A semiconductor structure, comprising:
a substrate;
a word line, arranged in the substrate; and
at least two dielectric layers, located between the word line and the substrate;
wherein the at least two dielectric layers have different dielectric constants;
wherein the substrate comprises an active region; the at least two dielectric layers comprise a gate dielectric layer and a high-K layer; a dielectric constant of the high-K layer is greater than a dielectric constant of the gate dielectric layer; the gate dielectric layer at least covers a channel region of the active region, the word line covers a first region of the gate dielectric layer, and the high-K layer covers a second region of the gate dielectric layer.

2. The semiconductor structure according to claim 1, wherein a word line trench is provided in the substrate; the gate dielectric layer covers a sidewall and a bottom wall of the word line trench, and defines a cavity in the word line trench; the word line is located in the cavity, and a top surface of the word line is lower than a top surface of the gate dielectric layer; the word line covers a bottom wall and part of a sidewall of the cavity, and the high-K layer covers other part of the sidewall of the cavity.

3. The semiconductor structure according to claim 2, further comprising a bit line contact member, wherein a bottom surface of the bit line contact member is in contact with a doped region of the active region, and a side surface of the bit line contact member is in contact with the high-K layer.

4. The semiconductor structure according to claim 2, wherein the word line comprises: a laminated structure, covering the bottom wall and part of the sidewall of the cavity; and a first work function layer, at least covering part of a side surface of the high-K layer.

5. The semiconductor structure according to claim 4, wherein a material of the first work function layer comprises at least one from the group of titanium aluminum alloy, titanium nitride, tantalum nitride, or tantalum carbide.

6. The semiconductor structure according to claim 4, wherein the first work function layer covers part of the side surface of the high-K layer, and the word line further comprises:
a first metal conductive layer, arranged on the laminated structure, wherein a bottom surface of the first metal conductive layer is in contact with a top surface of the laminated structure, and a side surface of the first metal conductive layer is in contact with the first work function layer.

7. The semiconductor structure according to claim 6, wherein the laminated structure comprises an anti-diffusion layer and a second metal conductive layer arranged on the anti-diffusion layer, and the first metal conductive layer and the second metal conductive layer are made of a same material.

8. The semiconductor structure according to claim 4, wherein the first work function layer covers part of the side surface of the high-K layer and a top surface of the laminated structure, the word line further comprises a second work function layer, and space defined by the first work function layer is filled with the second work function layer.

9. The semiconductor structure according to claim 8, wherein a material of the second work function layer comprises doped polysilicon.

10. A method of manufacturing a semiconductor structure, comprising:
providing a substrate; and
forming a word line and at least two dielectric layers in the substrate, wherein the at least two dielectric layers are located between the word line and the substrate, and the at least two dielectric layers have different dielectric constants;
wherein the forming a word line and at least two dielectric layers in the substrate comprises: forming a word line trench in the substrate; and forming a gate dielectric layer that covers a sidewall and a bottom wall of the word line trench and defines a cavity in the word line trench, and forming a word line and a high-K layer in the cavity, wherein a dielectric constant of the high-K layer is greater than a dielectric constant of the gate dielectric layer, a top surface of the word line is lower than a top surface of the gate dielectric layer, the word line covers a bottom wall and part of a sidewall of the cavity, the high-K layer covers other part of the sidewall of the cavity, and the gate dielectric layer and the high-K layer form the at least two dielectric layers.

11. The method of manufacturing a semiconductor structure according to claim 10, wherein the forming a word line and a high-K layer in the cavity comprises:
forming a laminated structure in the cavity, wherein the laminated structure covers the bottom wall and part of the sidewall of the cavity; and
forming a first work function layer and a first metal conductive layer, wherein the first work function layer covers part of a side surface of the high-K layer and exposes part of a top surface of the laminated structure, a bottom surface of the first metal conductive layer is in contact with the top surface of the laminated structure, and a side surface of the first metal conductive layer is in contact with the first work function layer.

12. The method of manufacturing a semiconductor structure according to claim 10, wherein the forming a word line and a high-K layer in the cavity comprises:
forming a laminated structure in the cavity, wherein the laminated structure covers the bottom wall and part of the sidewall of the cavity; and
forming a first work function layer and a second work function layer, wherein the first work function layer covers part of a side surface of the high-K layer and a top surface of the laminated structure, and space defined by the first work function layer is filled with the second work function layer.

13. The method of manufacturing a semiconductor structure according to claim 10, further comprising: forming a bit line contact member, wherein a bottom surface of the bit line contact member is in contact with a doped region in an active region of the substrate and the gate dielectric layer, and a side surface of the bit line contact member is in contact with the high-K layer.

* * * * *